United States Patent [19]
Hara et al.

[11] Patent Number: 6,152,772
[45] Date of Patent: Nov. 28, 2000

[54] ELECTRICAL CARD CONNECTOR

[75] Inventors: Tomohisa Hara, Nagono, Japan; Hung-Chi Yu, Hsi-Chih, Taiwan

[73] Assignee: Hon Hai Precision Ind. Co., Ltd., Taipei Hsien, Taiwan

[21] Appl. No.: 09/304,510

[22] Filed: May 3, 1999

[30] Foreign Application Priority Data

Nov. 6, 1998 [TW] Taiwan .................................. 87218449

[51] Int. Cl.$^7$ .............................................. H01R 13/648
[52] U.S. Cl. ............................................ 439/607; 439/64
[58] Field of Search ............................ 439/607, 95, 609, 439/64, 541.5, 159

[56] References Cited

U.S. PATENT DOCUMENTS 5,795,190  8/1998  Ono ......................................... 439/607
5,967,803  10/1999  Ho .......................................... 439/541.5
5,967,813  10/1999  Ho et al. .................................. 439/159

*Primary Examiner*—T. C. Patel
*Attorney, Agent, or Firm*—Wei Te Chung

[57] ABSTRACT

An electrical card connector includes a header, a number of terminals, a frame, a grounding plate and a number of fixing elements. The header has a number of passageways for receiving the terminals, two supporting arms extending from opposite ends thereof for engaging with supporting slots defined in opposite sides of the frame, and several locking slots defined therein. The grounding plate also defines locking slots therein corresponding to the locking slots of the header. The fixing elements engage with the locking slots, thus the grounding plate is securely mounted to the header.

4 Claims, 3 Drawing Sheets

ELECTRICAL CARD CONNECTOR

BACKGROUND OF THE INVENTION

The present invention relates to an electrical card connector, and particularly to an electrical card connector having a grounding plate securely mounted to a header thereof.

As technology progresses, computers are becoming increasingly compact while the functions thereof are becoming more complicated. The electrical card is particularly used in notebook computers to extend memory and input/output functions of the computer. In general, current electrical cards are constructed in accordance with the standard of PCMCIA (Personal Computer Memory Card International Association). A shielding shell is positioned around an engaging section of the electrical card and the electrical card connector to prevent electromagnetic interference from adversely affecting signal transmission. A conventional electrical card connector has a metal shell for contacting a spring plate to conduct static electricity to ground.

Referring to FIG. 1, a grounding plate 6 of a conventional electrical card connector is attached to a header 7 by engagement between locking plates 61,62,63 and receiving holes 71,72,73 respectively. However, the engaging force between locking plates 61,62,63 and receiving holes 71,72, 73 is not large enough to provide a reliable connection. After repeated insertions and withdrawals of a card, the grounding plate 6 will become shiftable from its fixed position whereby grounding tabs 64 of the grounding plate 6 cannot reliably contact with grounding dimples of a card (not shown) inserted into the connection. Related inventions are disclosed in U.S. Pat. Nos. 5,161,989; 5,288,274; and 5,399, 105.

BRIEF SUMMARY OF THE INVENTION

The main object of the present invention is to provide an electrical card connector having a fixing element for securely mounting a grounding plate to a header thereof.

To fulfill the above-mentioned object, the electrical card connector comprises a header, a plurality of terminals, an ejection mechanism, a frame, a grounding plate defining a number of locking slots, and a number of fixing elements. The header defines a plurality of passageways for receiving the terminals and a number of locking slots for receiving the fixing elements. Two supporting arms extend from opposite ends of the header for engaging with the frame. The frame includes two extending arms, a push bar and an ejection plate. An electrical card is received between the extending arms to connect with the terminals. The fixing element engages with the locking slots thereby securely mounting the grounding plate to the header.

Other objects, advantages and novel features of the invention will become more apparent from the following detailed description when taken in conjunction with the accompanying drawings.

DETAILED DESCRIPTION OF THE INVENTION

Figure 1:
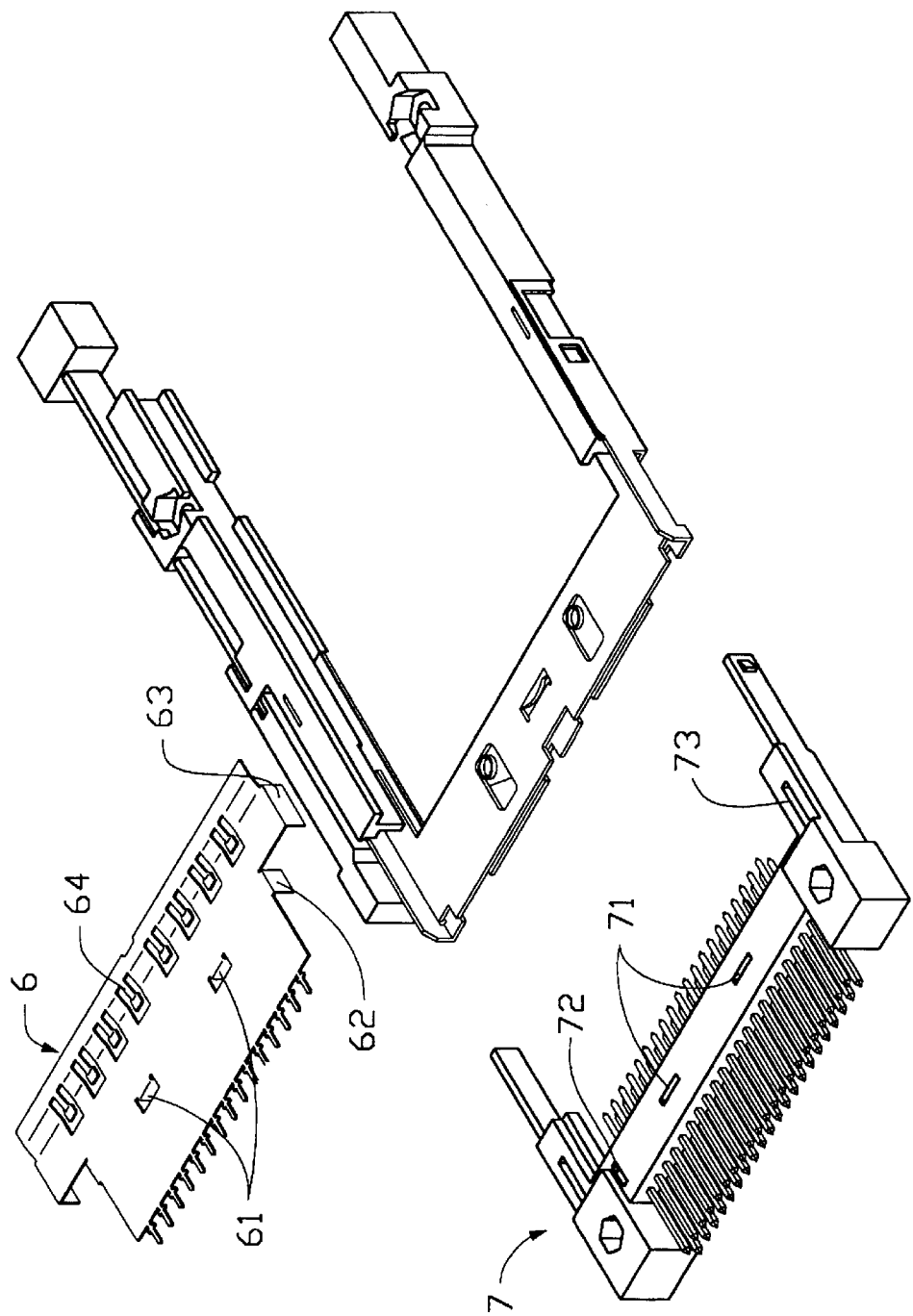
FIG. 1 is an exploded view of a conventional electrical card connector.
Figure 2:
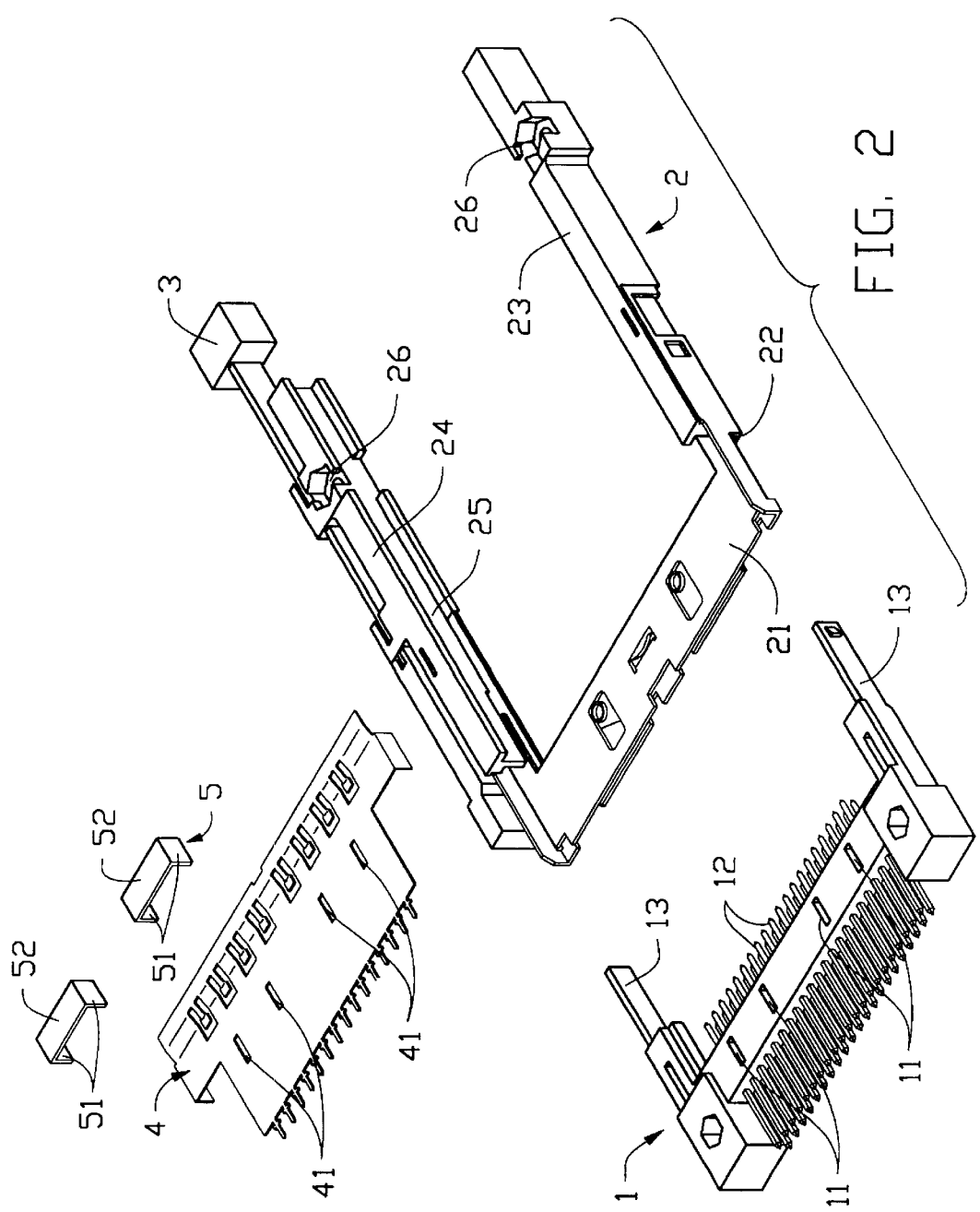
FIG. 2 is an exploded view of an electrical card connector in accordance with the invention.
Figure 3:
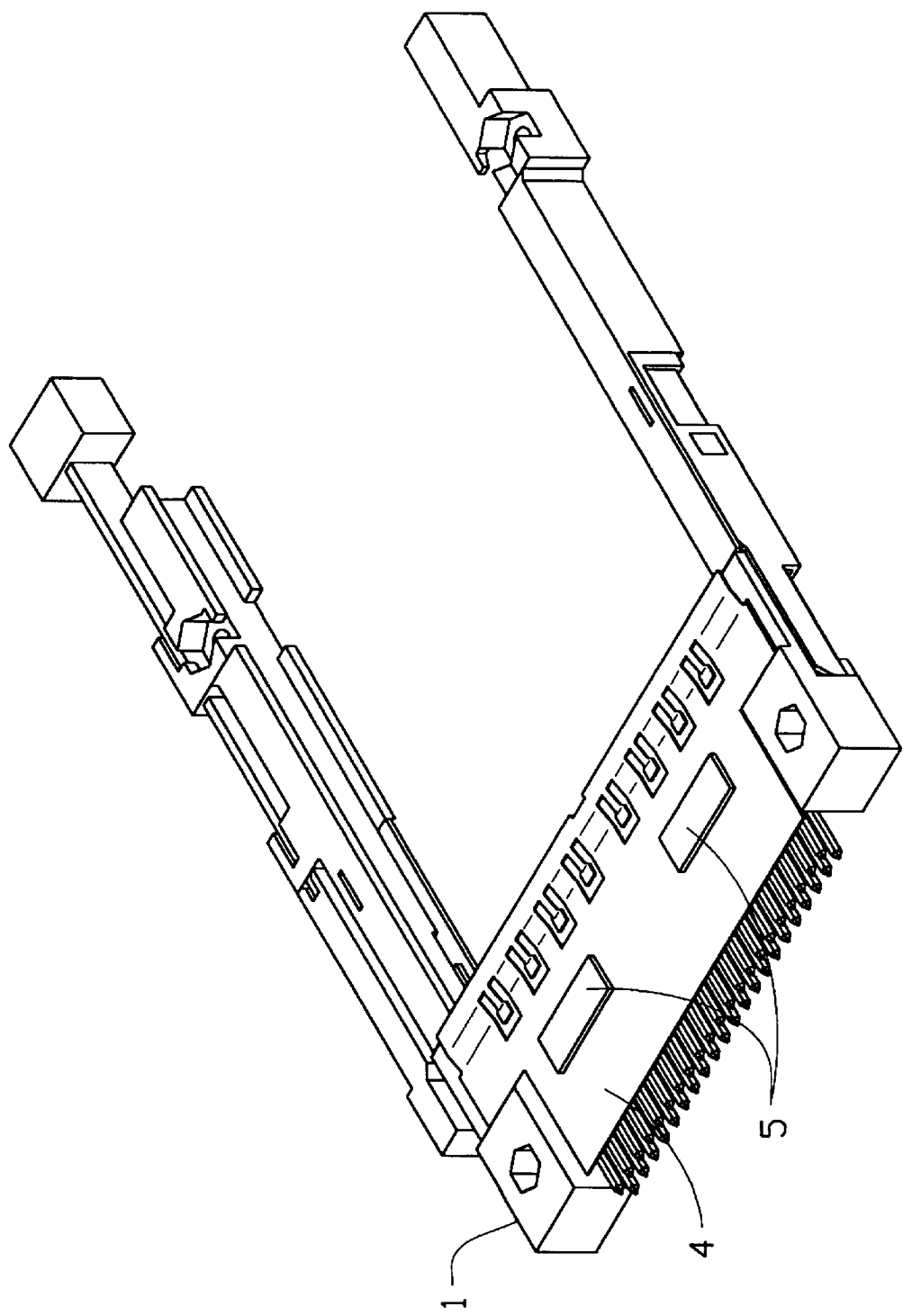
FIG. 3 is an assembled view of FIG. 2.

Referring to FIGS. 2 and 3, a header 1 receives a plurality of terminals 12 therein. Locking slots 11 are defined in a top surface of the header 1. Two supporting arms 13 extend from opposite ends of the header 1 for insertion into supporting slots 22 disposed on opposite sides of a frame 2. The frame 2 includes first and second extending arms 23, 24 and an ejection plate 21. The extending arms 23, 24 are positioned on opposite sides of the frame 2, and each extending arm 23, 24 defines a receiving slot 25 in an inner surface thereof for receiving an electrical card therebetween. A push bar 3 is positioned on an outer surface of the second extending arm 24 for ejecting the electrical card. A pair of recesses 26 defined in each extending arm 23, 24 are locked by rivets (not shown) for receiving a spring plate to contact with a grounding shell (not shown).

An electrical card (not shown) is inserted into the electrical card connector between the receiving slots 25 and connects with the terminals 12. A grounding plate 4 defining locking slots 41 therethrough is positioned on the header 1. A pair of U-shaped fixing elements 5 each has two engaging feet 51 connected by a connection section 52. The fixing elements 5 are inserted through the corresponding locking slots 41 of the grounding plate 4 and engage with the locking slots 11 of the header 1. Thus, the grounding plate 4 is securely mounted to the header 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electrical card connector comprising:

a header receiving a plurality of terminals, and having two supporting arms extending from opposite ends thereof;

a frame having two extending arms, a push bar positioned on an outer surface of one of the extending arms, an ejection plate positioned between ends of the extending arms and two supporting slots defined in opposite lateral sides of the frame for engaging with the supporting arms of the header;

a grounding plate positioned on the header and defining a number of first locking slots therethrough; and at least one fixing element extending through the first locking slots to engage with the header thereby securely mounting the grounding plate to the header;

wherein the header has a number of second locking slots defined therein for engaging with the at least one fixing element.

2. The electrical card connector as claimed in claim 1, wherein said at least one fixing element comprises two fixing elements and each fixing element has two feet connected by a connection section, the feet extending through the first locking slots and engaging with the second locking slots for mounting the grounding plate to the header.

3. The electrical card connector as claimed in claim 1, wherein the frame has at least a spring plate positioned on each extending arm for engaging with a grounding shell.

4. An electrical card connector comprising:

a header receiving a plurality of terminals, and having two support arms extending from opposite ends thereof;

a frame having two extending arms with ejection mechanism thereabouts, said frame secured to said header;

a grounding plate positioned on the header and defining a number of first locking slots therein;

said header defining a number of second locking slots in alignment with said first locking slots, respectively; and a fixing element having engaging feet each interferentially extending through both the corresponding first locking slot and second locking slot so as to have a connection section of the fixing element latchably abut against the grounding plate.

\* \* \* \* \*